United States Patent
Chen

(10) Patent No.: US 9,666,532 B2
(45) Date of Patent: May 30, 2017

(54) TWISTED ARRAY DESIGN FOR HIGH SPEED VERTICAL CHANNEL 3D NAND MEMORY

(71) Applicant: Macronix International Co., Ltd., Hsinchu (TW)

(72) Inventor: Shih-Hung Chen, Jhudong Township (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 15/164,730

(22) Filed: May 25, 2016

(65) Prior Publication Data

US 2016/0268201 A1    Sep. 15, 2016

Related U.S. Application Data

(63) Continuation of application No. 14/582,963, filed on Dec. 24, 2014, now Pat. No. 9,373,632, which is a
(Continued)

(51) Int. Cl.
*H01L 23/528* (2006.01)
*H01L 27/115* (2017.01)
(Continued)

(52) U.S. Cl.
CPC ...... *H01L 23/5283* (2013.01); *H01L 23/5226* (2013.01); *H01L 27/0207* (2013.01);
(Continued)

(58) Field of Classification Search
CPC ......... H01L 27/11565; H01L 27/11568; H01L 27/1157; H01L 27/11582; H01L 23/5283
See application file for complete search history.

(56) References Cited

U.S. PATENT DOCUMENTS

| 6,906,940 B1 | 6/2005 | Lue |
|---|---|---|
| 7,315,474 B2 | 1/2008 | Lue |

(Continued)

FOREIGN PATENT DOCUMENTS

| EP | 2048709 A2 | 4/2009 |
|---|---|---|
| TW | 102139597 | 10/2013 |
| TW | 201436193 A | 9/2014 |

OTHER PUBLICATIONS

Chen, et al., "Highly Scalable Vertical Gate 3-D NAND", 2012 IEEE International Electron Devices Meeting (IEDM), Feb. 4, 2013, 9 pages.
(Continued)

*Primary Examiner* — Allison P Bernstein
(74) *Attorney, Agent, or Firm* — Haynes Beffel & Wolfeld LLP

(57) ABSTRACT

Roughly described, a memory device has a multilevel stack of conductive layers. Vertically oriented pillars each include series-connected memory cells at cross-points between the pillars and the conductive layers. SSLs run above the conductive layers, each intersection of a pillar and an SSL defining a respective select gate of the pillar. Bit lines run above the SSLs. The pillars are arranged on a regular grid which is rotated relative to the bit lines. The grid may have a square, rectangle or diamond-shaped unit cell, and may be rotated relative to the bit lines by an angle θ where tan(θ)=±X/Y, where X and Y are co-prime integers. The SSLs may be made wide enough so as to intersect two pillars on one side of the unit cell, or all pillars of the cell, or sufficiently wide as to intersect pillars in two or more non-adjacent cells.

11 Claims, 18 Drawing Sheets

Related U.S. Application Data continuation-in-part of application No. 14/157,550, filed on Jan. 17, 2014, now Pat. No. 9,219,074.

(51) Int. Cl.

| | |
|---|---|
| H01L 27/11582 | (2017.01) |
| H01L 27/11565 | (2017.01) |
| H01L 27/02 | (2006.01) |
| H01L 27/1157 | (2017.01) |
| H01L 23/522 | (2006.01) |

(52) U.S. Cl.
CPC .... *H01L 27/1157* (2013.01); *H01L 27/11565* (2013.01); *H01L 27/11582* (2013.01)

(56) References Cited

U.S. PATENT DOCUMENTS

| | | |
|---|---|---|
| 7,420,242 B2 | 9/2008 | Lung |
| 7,696,559 B2 | 4/2010 | Arai et al. |
| 7,778,073 B2 | 8/2010 | Willer et al. |
| 7,851,849 B2 | 12/2010 | Kiyotoshi |
| 8,008,732 B2 | 8/2011 | Kiyotoshi et al. |
| 8,198,670 B2 * | 6/2012 | Aoyama ............ H01L 27/11565 257/316 |
| 8,363,476 B2 | 1/2013 | Lue et al. |
| 8,427,881 B2 * | 4/2013 | Jang .................. G11C 16/0483 365/185.02 |
| 8,467,219 B2 | 6/2013 | Lue |
| 8,503,213 B2 | 8/2013 | Chen et al. |
| 8,648,438 B2 | 2/2014 | Cai et al. |
| 8,759,899 B1 | 6/2014 | Lue et al. |
| 8,785,319 B2 | 7/2014 | Park et al. |
| 8,853,818 B2 | 10/2014 | Lue |
| 9,142,538 B1 | 9/2015 | Chen |
| 9,147,468 B1 | 9/2015 | Lue |
| 9,196,364 B2 | 11/2015 | Kim et al. |
| 9,219,073 B2 | 12/2015 | Chen |
| 9,219,074 B2 | 12/2015 | Chen |
| 9,280,420 B2 | 3/2016 | Yoon et al. |
| 2005/0280061 A1 | 12/2005 | Lee |
| 2007/0045708 A1 | 3/2007 | Lung |
| 2007/0158736 A1 | 7/2007 | Arai et al. |
| 2007/0252201 A1 | 11/2007 | Kito et al. |
| 2008/0073635 A1 | 3/2008 | Kiyotoshi et al. |
| 2008/0175032 A1 | 7/2008 | Tanaka et al. |
| 2008/0180994 A1 | 7/2008 | Katsumata et al. |
| 2009/0097321 A1 | 4/2009 | Kim et al. |
| 2009/0184360 A1 | 7/2009 | Jin et al. |
| 2010/0270593 A1 | 10/2010 | Lung et al. |
| 2011/0018051 A1 | 1/2011 | Kim et al. |
| 2011/0286283 A1 | 11/2011 | Lung et al. |
| 2012/0007167 A1 | 1/2012 | Hung et al. |
| 2012/0068241 A1 | 3/2012 | Sakuma et al. |
| 2012/0119283 A1 | 5/2012 | Lee et al. |
| 2012/0182806 A1 | 7/2012 | Chen et al. |
| 2013/0260559 A1 | 10/2013 | Park et al. |
| 2014/0140131 A1 | 5/2014 | Yeh et al. |
| 2015/0105639 A1 | 4/2015 | Watanabe |
| 2015/0206896 A1 | 7/2015 | Chen |
| 2015/0206898 A1 | 7/2015 | Chen |
| 2015/0206899 A1 | 7/2015 | Chen |
| 2015/0371998 A1 | 12/2015 | Lue |
| 2016/0260732 A1 | 9/2016 | Lue |
| 2016/0260733 A1 | 9/2016 | Lue |

OTHER PUBLICATIONS

Bae, JH, "Samsung's 3D V-NAND breaks through chip scaling limits", http://itersnews.com, dated Feb. 14, 2014, 5 pages.

Das, Arabinda, "Samsung 2x nm LPDDR3 DRAM Scales Memory Wall", EE Times, http://www.eetimes.com/author.asp?section id+36&eoc id+1321629&print=yes, dated Mar. 25, 2014, 6 pages.

Komori, et al., "Disturbless Flash Memory due to High Boost Efficiency on BiCS Structure and Optimal Memory Film Stack for Ultra High Density Storage Device", Electron Devices Meeting, IEDM 2008, IEEE International, Dec. 15-17, 2008, San Francisco, California, 4 pages.

Lai, et al., "A Multi-Layer Stackable Thin-Film Transistor (TFT) NAND-Type Flash Memory," IEEE Int'l Electron Devices Meeting, Dec. 11-13, 2006, pp. 1-4.

Jung et al., "Three Dimensionally Stacked NAND Flash Memory Technology Using Stacking Single Crystal Si Layers on ILD and TANOS Structure for Beyond 30nm Node," IEEE Int'l Electron Devices Meeting, Dec. 11-13, 2006, 4 pages Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009, Jun. 16-18, 2009, 2 pages.

Choi et al., "Performance Breakthrough in NOR Flash Memory With Dopant-Segregated Schottky-Barrier (DSSB) SONOS Devices," 2009 Symp. on VLSI Technology Jun. 16-18, 2009, Digest of Technical Papers, pp. 222-223.

Fukuzumi et al. "Optimal Integration and Characteristics of Vertical Array Devices for Ultra-High Density, Bit-Cost Scalable Flash Memory," IEEE Dec. 10-12, 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6-1-27.6.4.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)" IEEE 2008 Symposium on VLSI Technology Digest of Technical Papers, Jun. 17-19, 2008, pp. 122-123.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

Chen, et al., "A Highly Pitch Scalable 3D Vertical Gate (VG) NAND Flash Decoded by a Novel Self-Aligned Independently Controlled Double Gate (IDG) String Select Transistor (SSL)," 2012 Symp. on VLSI Technology (VLSIT), Jun. 12-14, 2012. 91-92.

Hung, et al., "A highly scalable vertical gate (VG) 3D NAND Flash with robust program disturb immunity using a novel PN diode decoding structure," 2011 Symp. on VLSI Technology (VLSIT), Jun. 14-16, 2011, 2 pages.

Lue, et al., "A highly scalable 8-layer 3D vertical-gate (VG) TFT NAND Flash using junction-free buried channel BE-SONOS device," 2010 Symposium on VLSI Technology (VLSIT), Jun. 15-17, 2010, 2 pages.

Kim, et al., "Three-Dimensional nand Flash Architecture Design Based on Single-Crystalline Stacked Array," Electron Devices, IEEE Transactions on , vol. 59, No. 1, pp. 35,45, Jan. 2012.

Wang, Michael, "Technology Trends on 3D-NAND Flash Storage", Impact 2011, Taipei, dated Oct. 20, 2011, found at 222.impact.org. tw/2011/files/newsfile/201111110190.pdf.

Nowak, et al., "Intrinsic fluctuations in Vertical NAND flash memories," VLSI Technology (VLSIT), 2012 Symposium on , vol., no., pp. 21,22, Jun. 12-14, 2012.

U.S. Appl. No. 14/157,550—filed Jan. 17, 2014, entitled Three-Dimensional Semiconductor Device, by Shih-Hung Chen, 44 pages.

U.S. Appl. No. 14/582,963—Office Action dated Nov. 5, 2015, 6 pages.

* cited by examiner

TWISTED ARRAY DESIGN FOR HIGH SPEED VERTICAL CHANNEL 3D NAND MEMORY

CROSS-REFERENCE TO OTHER APPLICATIONS

This application is a Continuation of U.S. application Ser. No. 14/582,963, filed 24 Dec. 2014, entitled TWISTED ARRAY DESIGN FOR HIGH SPEED VERTICAL CHANNEL 3D NAND MEMORY (P1030081US), which application is a Continuation-In-Part of U.S. application Ser. No. 14/157,550, filed 17 Jan. 2014, entitled THREE-DIMENSIONAL SEMICONDUCTOR DEVICE (P1020208), now U.S. Pat. No. 9,219,074, issued 22 Dec. 2015. Both applications are incorporated by reference herein.

This application also makes reference to U.S. application Ser. No. 14/582,848, filed 24 Dec. 2014, entitled PARALLELOGRAM CELL DESIGN FOR HIGH SPEED VERTICAL CHANNEL 3D NAND MEMORY, by inventor Shih-Hung Chen, incorporated by reference herein.

BACKGROUND

Field of the Invention

The present invention relates to high density memory devices, and particularly to memory devices in which multiple planes of memory cells are arranged to provide a three-dimensional 3D array.

Description of Related Art

As critical dimensions of devices in integrated circuits shrink to the limits of common memory cell technologies, designers have been looking to techniques for stacking multiple planes of memory cells to achieve greater storage capacity, and to achieve lower costs per bit. For example, thin film transistor techniques are applied to charge trapping memory technologies in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006, incorporated by reference herein.

Another structure that provides vertical NAND cells in a charge trapping memory technology is described in Katsumata, et al., "Pipe-shaped BiCS Flash Memory with 16 Stacked Layers and Multi-Level-Cell Operation for Ultra High Density Storage Devices," 2009 Symposium on VLSI Technology Digest of Technical Papers, 2009, incorporated by reference herein. The structure described in Katsumata et al. includes a vertical NAND gate, using silicon-oxide-nitride-oxide-silicon SONOS charge trapping technology to create a storage site at each gate/vertical channel interface. The memory structure is based on a column of semiconductor material arranged as the vertical channel for the NAND gate, with a lower select gate adjacent the substrate, and an upper select gate on top. A plurality of horizontal word lines is formed using planar word line layers that intersect with the columns, forming a so-called gate all around cell at each layer.

FIG. 1 is a horizontal cross-section of a column of a pipe-shaped BiCS flash cell, such as described in the Katsumata et al. publication, at the level of a word line. The structure includes a pillar 15 having a center core 110 of semiconductor material which extends vertically through a stack of word line layers. The core 110 may have a seam 111 through the middle that arises from the deposition technique. A dielectric charge trapping structure comprising for example a first layer 112 of silicon oxide, a layer 113 of silicon nitride and a second layer 114 of silicon oxide (referred to as ONO), or another multilayer dielectric charge trapping structure surrounds the core 110. A gate all-around word line is intersected by the pillar. A frustum of the pillar at each layer combines with the gate all-around word line structure at that layer, to form a memory cell.

FIG. 2 is a perspective view of a 3D semiconductor device. It comprises a multilevel stack of word line conductive layers 11, each parallel to the substrate 10; a plurality of pillars 15 oriented orthogonally to the substrate, each of the pillars comprising a plurality of series-connected memory cells located at cross-points between the pillars and the conductive layers; and a plurality of string select lines (SSLs) 12 oriented parallel to the substrate and above the conductive layers 11, each of the string select lines intersecting a respective row of the pillars. Each intersection of a pillar and a string select line defines a select gate of the pillar. The structure also includes a plurality of parallel bit line conductors 20 in a layer parallel to the substrate and above the string select lines. Each of the bit line conductors superposes a respective column of the pillars, and each of the pillars underlies one of the bit line conductors. Lower select lines (lower SG) 13 are further formed under the memory layers 11. The pillars may be constructed as described above with respect to FIG. 1.

FIG. 3 is a top view of a portion of the structure of FIG. 2. It can be seen in both figures that the word line conductive layers 11 intersect only some of the pillars in the overall structure; the word line conductive layer 11 defines a block of memory cells. Thus to read data from a particular block of the memory, control circuitry activates a word line 11 to select a block of cells and a particular layer of the stack, and further activates a string select line 12 to select a particular row. A lower select gate (not shown) is activated as well. A row of cells is then read out in parallel via the bit line conductors 20 into a page buffer (not shown). ("Activate", as used herein, means to apply a particular bias so as to give effect to the connected cells or switches. The bias may be high or low, depending on the memory design.) Depending on the product specification and design, the page buffer may hold two or more rows of data, in which case a full page read operation would involve successive activation of two or more SSLs 12.

While 3D stacking memory structures hold the promise of greatly increased memory density, they also introduce significant process challenges because, among other things, of the need to etch very deep holes through many layers. Such deep holes have to be made wider, and have to be placed at greater center-to-center distance from each other laterally, in order to meet process windows. As fabrication processes improve, capacity may be increased not only by increasing the number of word line planes in the stack, but also by reducing the spacing between the pillars. FIG. 4 is a top view of a scaled down structure in which both the number of bit lines 20 in a block and the number of SSLs 12 in the block have been increased. Not only does the cost decrease, but increased read/write data rate can be achieved as well because the larger number of bit lines 20 means increased parallel operation. On the other hand, the increased number of SSLs 12 means more cells will suffer Vpass disturb due to word line select. Unit cell capacitance also increases with the number of SSLs 12, thereby increasing power consumption and slowing device operation.

Increasing bit density by increasing the number of word line conductive layers 11 in the stack also has downsides, even aside from the expected process challenges of increased numbers of layers. In FIG. 2 it can be seen that a typical arrangement has a stepped contact structure to the word line conductive layers 11. Deep etches are made through the structure in order to form contacts 22 to connect the conductive layers 11 to metal interconnects 24 above. These contacts 22 are also shown symbolically in the top view of FIG. 4. In a typical design, the number of rows of pillars 15 in a block is at least as great as the number of contacts 22, and hence memory layers. See, for example, Komori, Y., et al., "Disturbless flash memory due to high boost efficiency on BiCS structure and optimal memory film stack for ultra high density storage device," Electron Devices Meeting, 2008, IEDM 2008, IEEE International, vol., no., pp. 1-4, 15-17 (December 2008) at 2, incorporated herein by reference. Thus increasing the number of memory layers also increases the number of SSLs 12, and again increases power consumption and slows device operation.

An opportunity therefore arises to create robust solutions to the problem of increasing bit density of 3D memory structures while reducing the negative impacts that such increases tend to cause. Better chip yields, and denser, and more powerful circuits, components and systems may result.

SUMMARY

Roughly described, the present technology provides a memory device having a multilevel stack of conductive layers oriented parallel to a substrate. Pillars oriented orthogonally to the substrate each include series-connected memory cells at cross-points between the pillars and the conductive layers. String select lines (SSLs) are disposed above the conductive layers, each intersection of a pillar and an SSL defining a respective select gate of the pillar. Bit lines are disposed above the string select lines. The pillars in the plurality of pillars are arranged on a regular grid which is rotated relative to the bit line conductors. The grid may have a square, rectangle or diamond-shaped unit cell, and may be rotated relative to the bit lines by an angle $\theta$ where $\tan(\theta)=\pm X/Y$, where X and Y are co-prime integers. The SSLs may be made wide enough so as to intersect two pillars on one side of the unit cell, or all pillars of the cell, or sufficiently wide as to intersect pillars in two or more non-adjacent cells. The rotation permits a higher density of bit lines, thereby enabling a higher data rate due to increased parallel operation. It also enables a smaller number of SSLs, thereby reducing read disturbance, reducing power consumption and further improving data rate by reducing unit cell capacitance.

In other aspects, roughly described, the present technology provides a memory device having a multilevel stack of conductive layers oriented parallel to a substrate. Pillars oriented orthogonally to the substrate each include series-connected memory cells at cross-points between the pillars and the conductive layers. String select lines (SSLs) are disposed above the conductive layers, each intersection of a pillar and an SSL defining a respective select gate of the pillar. Bit lines are disposed above the string select lines. The pillars in the plurality of pillars are arranged on a regular grid having a unit cell which is a non-rectangular parallelogram. The pillars may be arranged so as to define a number of parallel pillar lines, the pillar lines having an acute angle $\theta>0°$ of intersection with the bit line conductors, each line of pillars having exactly n>1 pillars all intersecting a particular common one of the string select lines. The arrangement permits a higher density of bit lines, thereby enabling a higher data rate due to increased parallel operation. It also enables a smaller number of SSLs, thereby reducing disturbance, reducing power consumption and further improving data rate by reducing unit cell capacitance.

The above summary of the invention is provided in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description that is presented later. Particular aspects of the invention are described in the claims, specification and drawings.

BRIEF DESCRIPTION OF THE DRAWINGS

The invention will be described with respect to specific embodiments thereof, and reference will be made to the drawings, in which.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the spirit and scope of the present invention. Thus, the present invention is not intended to be limited to the embodiments shown, but is to be accorded the widest scope consistent with the principles and features disclosed herein.

Figure 1:
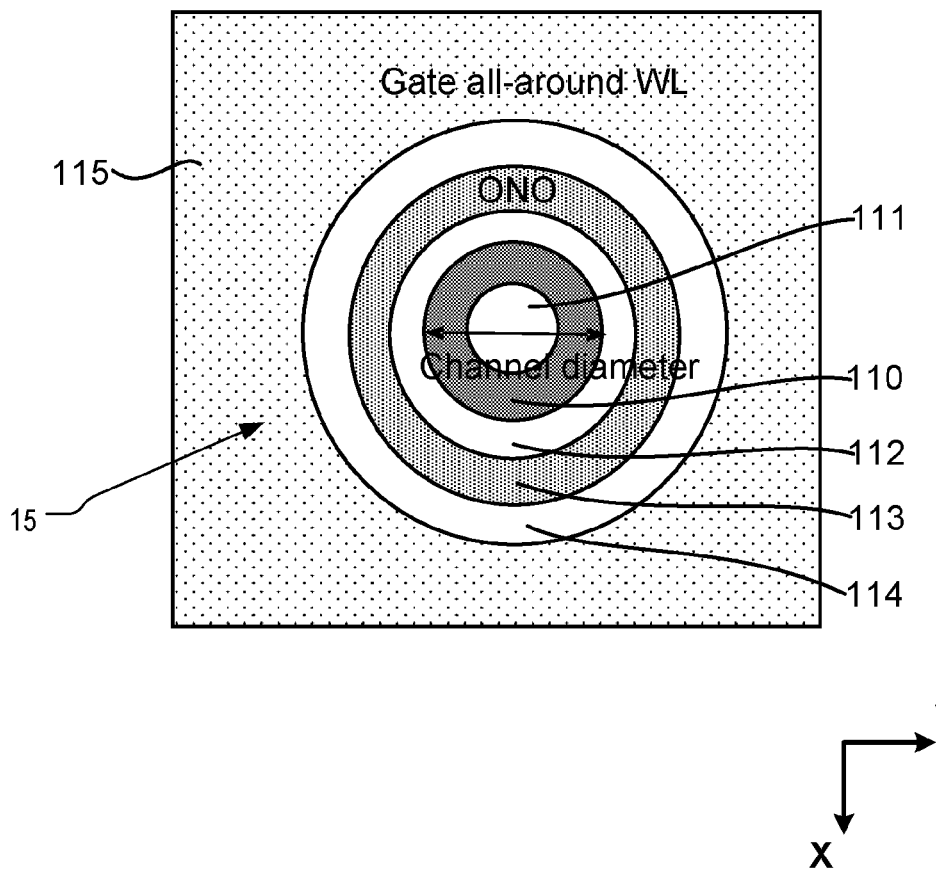
FIG. 1 illustrates a horizontal cross-section of a column of a pipe-shaped BiCS flash cell.
Figure 2:
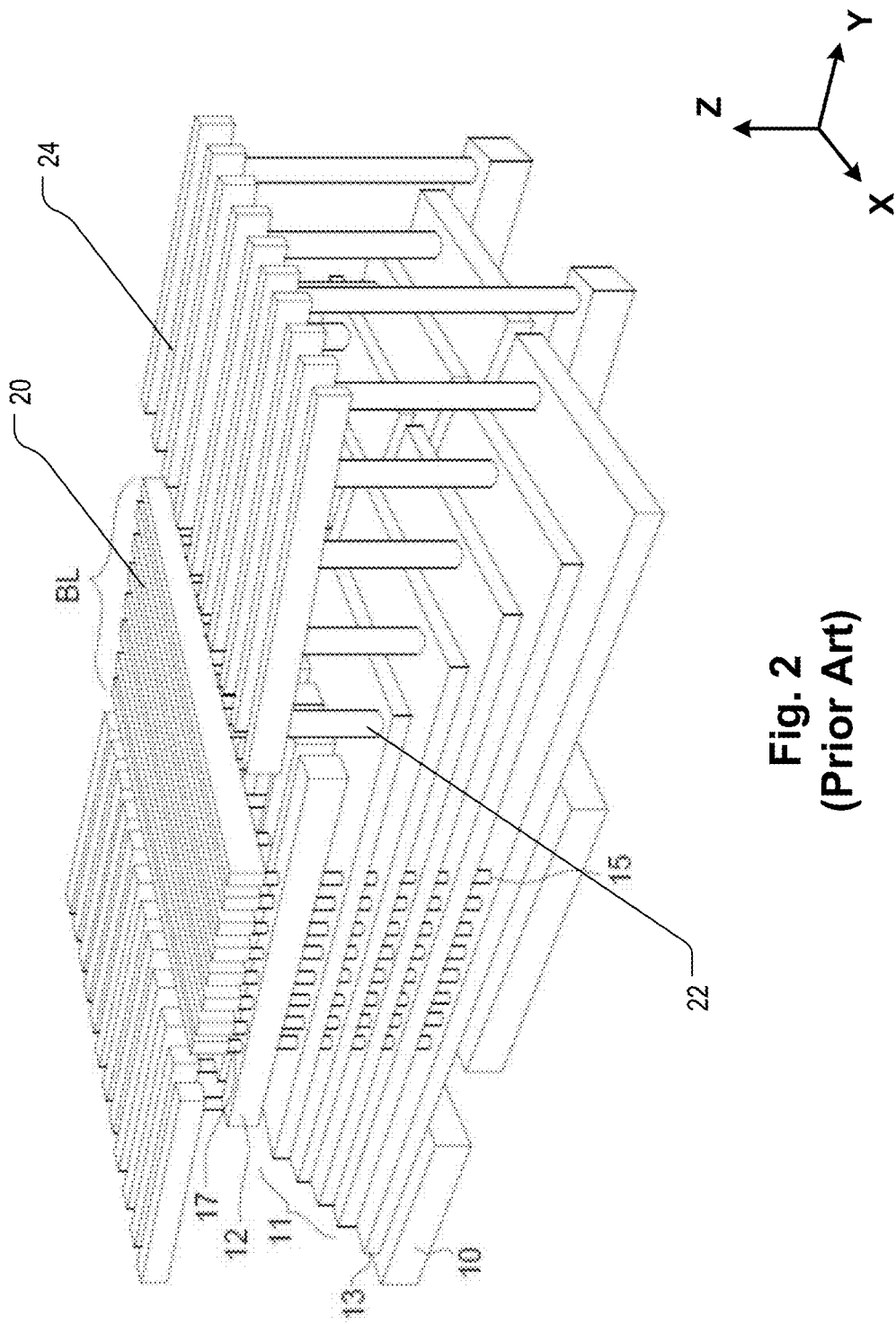
FIG. 2 is a perspective view of a 3D semiconductor device.
Figure 3:
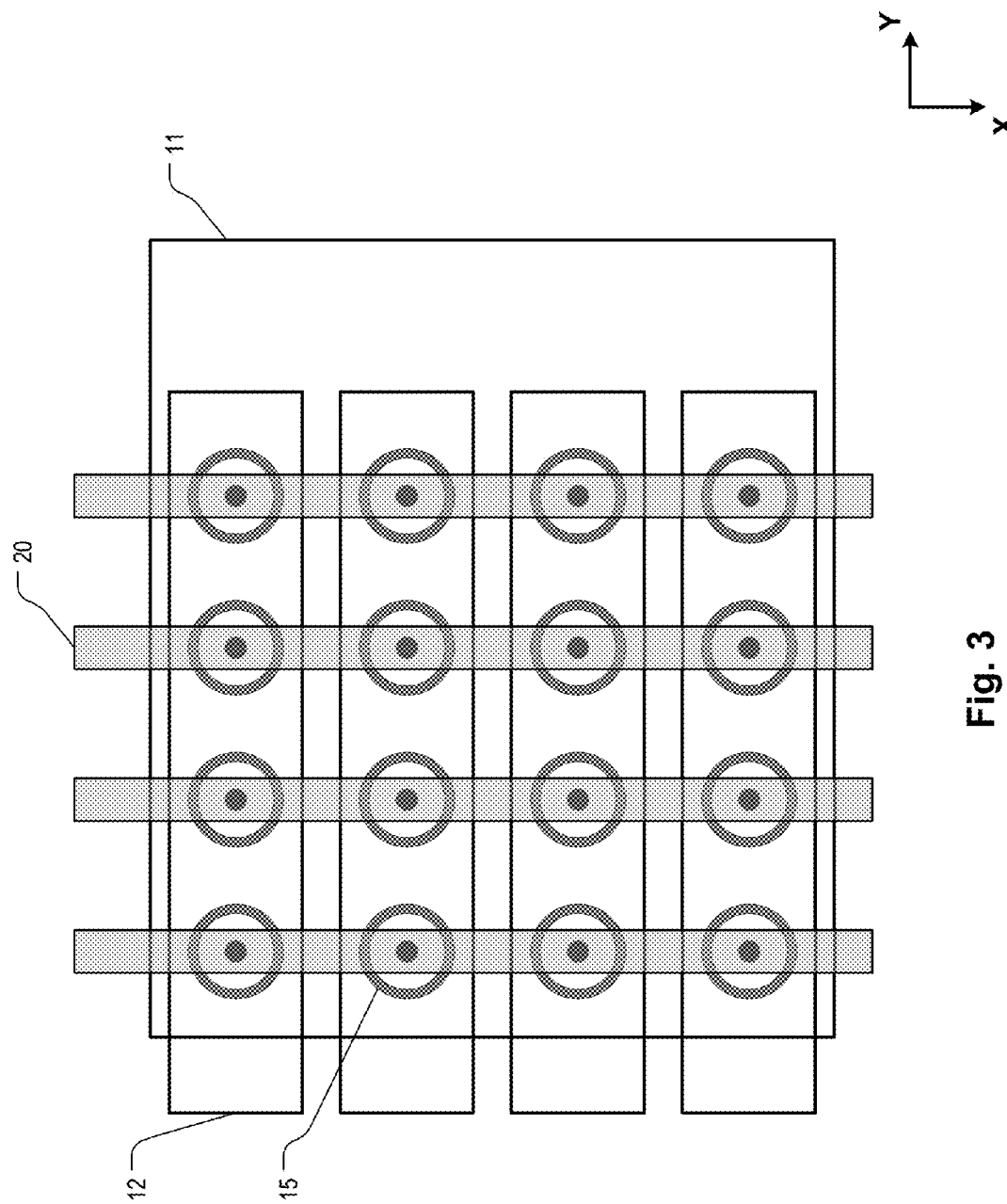
FIG. 3 is a top view of a portion of the structure of FIG. 2.
Figure 4:
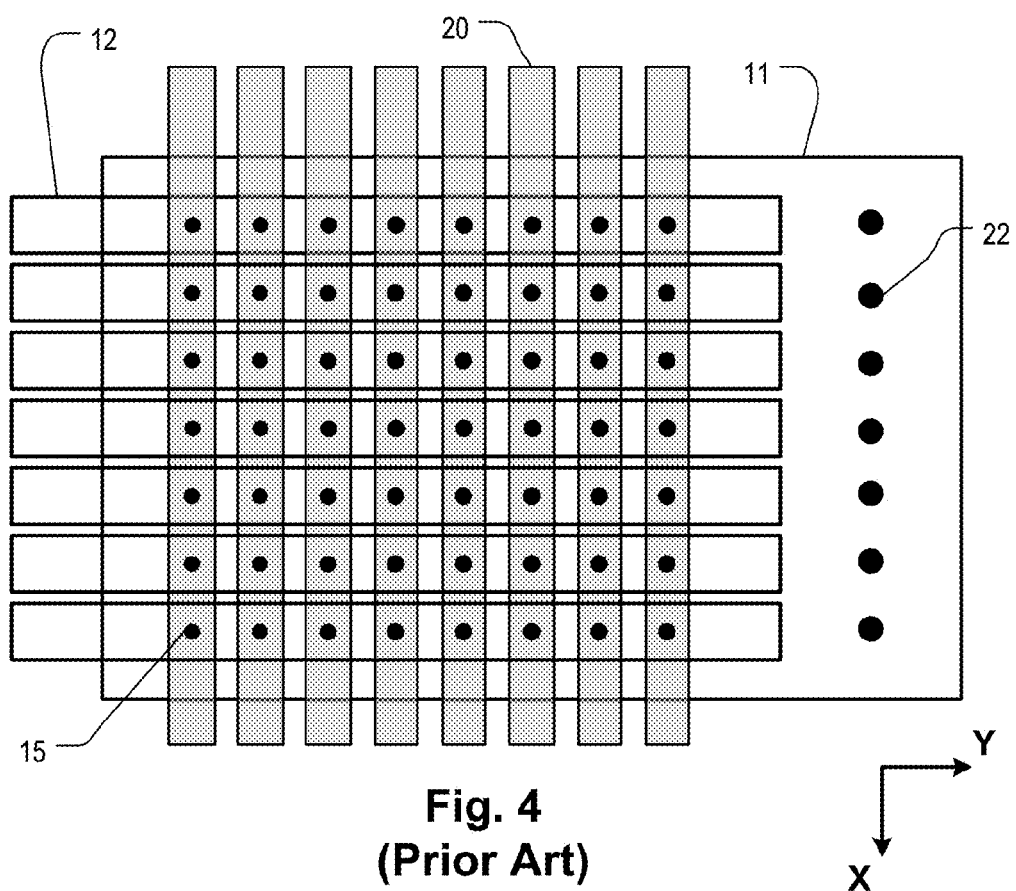
FIG. 4 is a top view of a portion of the structure of FIG. 2, scaled down to permit more bit lines and SSLs.
Figure 5:
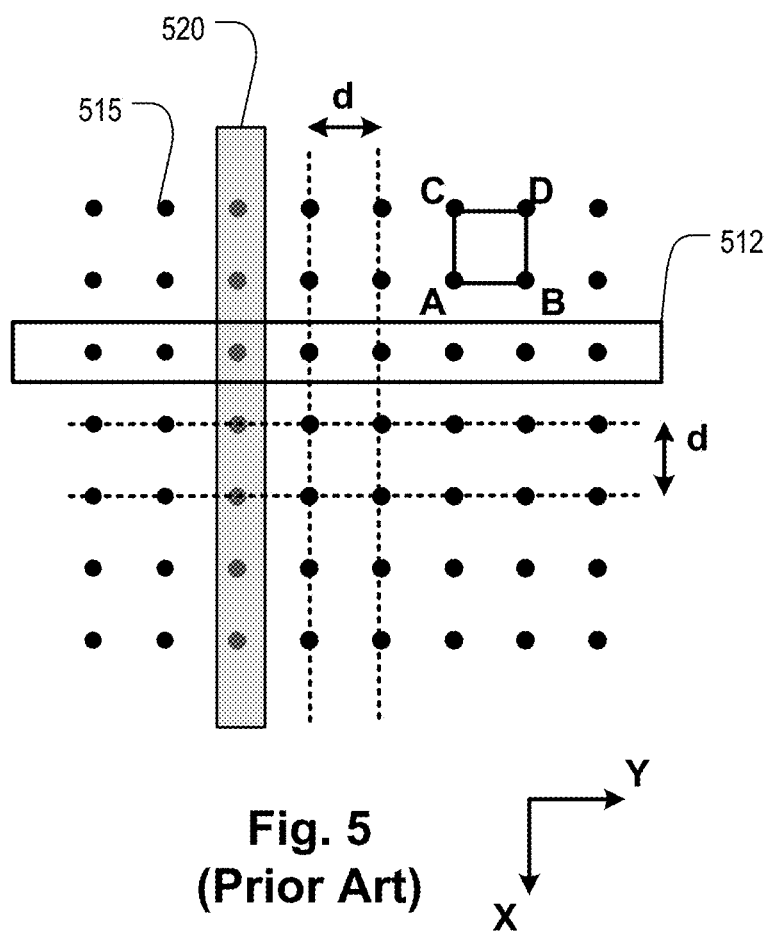
FIG. 5 is a top view of an example array of pillars in a conventional 3D structure such as that shown in FIGS. 2 and 4.

FIG. 5 is a top view of an example array of pillars in a conventional 3D structure such as that shown in FIGS. 2 and 4. Each dot in FIG. 5 represents the lateral position of a corresponding pillar 515. As used herein, "lateral" dimensions refer to dimensions of the structure which are parallel to the substrate (e.g. dimensions labeled X and Y in FIGS. 1, 2, 3 and 4). The structure includes all the other elements shown in FIG. 2, but most of those elements have been omitted from FIG. 5 for clarity of illustration. In particular, the structure represented by FIG. 5 includes the multilevel stack of conductive layers 11, each of the layers being oriented parallel to the substrate. The plurality of string select lines 512 (one of which is shown in FIG. 5) is oriented parallel to the substrate and above the conductive layers, the string select lines being rectangular and having their long dimension oriented in the Y dimension as shown in FIG. 5. As used herein, layers which are termed "above" or "below" other layers, can in various embodiments be separated from such other layers by one or more intervening layers. The same interpretation is intended for layers being described as "superposing", "underlying" or "over" another layer.

Each of the string select lines intersects a respective distinct subset of the pillars 515, and each of the intersections of a pillar and a string select line defines a respective select gate of the pillar 515. A plurality of parallel bit line conductors 520 (one of which is shown in FIG. 5) extending in the X dimension in FIG. 5 are disposed in a layer parallel to the substrate and above the string select lines, each of the bit line conductors superposing a respective column of the pillars 515. In addition, each of the pillars 515 underlies one of the bit line conductors. Each of the pillars 515 is oriented orthogonally to the substrate (vertically, in the Z dimension as shown in FIG. 2), and includes a plurality of series-connected memory cells located at cross-points between the pillars and the conductive layers. In one embodiment, the lateral cross-section of a column is as illustrated in FIG. 1.

In the arrangement of FIG. 5, it can be seen that the pillars 515 in the array pillars are arranged on a regular grid having two lateral dimensions X and Y. The X dimension is parallel to the bit line conductors, and the Y dimension is orthogonal to the bit line conductors. As used herein, a "regular grid" or "regular array" is a grid (array) which can be divided into adjacent unit cells which collectively fill the array, and all of which have the same shape and size. In FIG. 5 the unit cell is a square and an example is shown as square ABDC. While the grid itself has numerous pillars, the boundaries of the grid, as the term "grid" is used herein, need not have any regularity in a particular embodiment.

As used herein, a "unit cell" in a regular grid is defined as a parallelogram whose four vertices are located at four pillars of the grid. In FIG. 5, for example, the unit cell parallelogram is defined by pillars A, B, C and D. As used herein, the unit cell is defined by starting with a pillar A, then choosing as pillar B a pillar in the grid which is "nearest" to pillar A, then choosing as pillar C a pillar in the grid which is non-collinear with pillars A and B but which is otherwise "nearest" pillar A in the grid, then choosing pillar D as the pillar located at the fourth vertex of the parallelogram. As used herein, unless otherwise stated, the "distance" between pillars refers to the Euclidean center-to-center distance between the pillars. In addition, the "distance in a particular dimension" between two pillars, as used herein, is the difference between the coordinates of the two pillars in that dimension; ignoring the coordinates in the other dimensions. For example, in FIG. 5, the distance between pillars A and B is d, as is the distance between pillars A and C. The "distance" (i.e. Euclidean distance) between pillars B and C is d√2, but the "distance in the Y dimension" between pillars B and C is d. Also as used herein, the "nearest" pillar to a given pillar is a pillar having the shortest distance to the given pillar. If more than one pillar has the same shortest distance to the given pillar, then any one of them qualifies as being the pillar "nearest" to the given pillar.

In the grid of FIG. 5, the unit cell is a square. As used herein, the term "square" is a special case of the term "rectangle", in that a square is a rectangle whose four sides all have equal length. Similarly, a "square" is also a special case of a "rhombus", in that a square is also a rhombus whose four angles are right angles. Furthermore, squares, rectangles and rhombuses are all special cases of the term "parallelogram". A rectangle is a parallelogram whose four angles are right angles; a rhombus is a parallelogram whose four sides have equal length, and a square is a parallelogram whose four angles are right angles and whose four sides have equal length. Thus the square ABDC in FIG. 5 can equally be called a rhombus, a rectangle, and a parallelogram.

Figure 6:
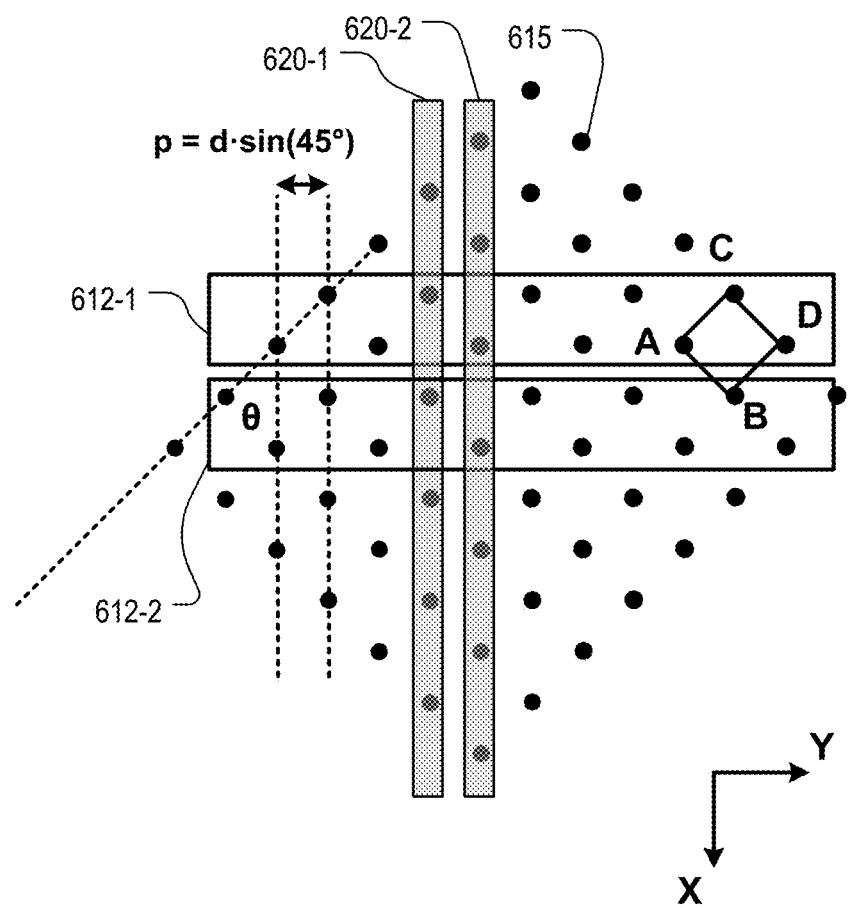
FIG. 6 is a top view of an array of pillars in a 3D structure, rotated according to an aspect of the invention.

FIG. 6 is a top view of an array of pillars in a 3D structure according to an aspect of the invention. As with FIG. 5, each dot in FIG. 6 represents the lateral position of a corresponding pillar 615. The structure includes all the other elements seen in FIG. 2, though most have been omitted from FIG. 6 for clarity of illustration. Two string select lines 612-1 and 612-2 (collectively 612) are shown, as are two bit line conductors 620-1 and 620-2 (collectively 620). Although the boundaries of the grid portion shown in FIG. 6 match a rotated version of the boundaries of the grid portion that appears in FIG. 5, it will be appreciated that both grids can include more pillars that only those shown. In FIG. 6, for example, the grid typically includes additional pillars which continue the pattern to a full, rectangular region having boundaries which are aligned with and orthogonal to the bit lines.

As with the structure of FIG. 5, each of the string select lines 612 in FIG. 6 intersects a respective distinct subset of the pillars 615, the intersections defining select gates. Similarly, each of the bit line conductors 620 superposes a respective column of the pillars 615, and each of the pillars 615 underlies one of the bit line conductors 620. In the structure of FIG. 6, however, the grid of pillars is rotated clockwise relative to the bit lines 620 by an angle θ=45°. This provides two advantages. First, the bit lines 620 are on a narrower pitch, p=d·sin(45°). This permits a higher density of bit lines without any reduction needed in the spacing d between adjacent pillars in the grid. Second, the number of SSLs 612 is reduced because each SSL 620 has been made wide enough (in the dimension parallel to the bit lines 620) to intersect two rows of pillars. Stated differently, each SSL 620 is wide enough to intersect at least two pillars of a unit cell, on the same side of the unit cell. For example, in FIG. 6, SSL 612-1 intersects pillars A and C of the unit cell ABDC. (SSL 612-1 also intersects pillar D.) And despite intersecting two rows of pillars, each intersection of one of the string select lines 612 and one of the bit line conductors 620 still uniquely enables a single one of the pillars in the grid. That is, activation of one word line conductor 11 and one SSL 612 still selects only a single memory cell to each bit line conductor 620. Thus the rotated grid of FIG. 6 achieves both a higher density of bit lines 620, thereby enabling a higher data rate due to increased parallel operation, and also a lower number of SSLs, thereby reducing read disturbance, reducing power consumption and further improving data rate by reducing unit cell capacitance.

Figure 7:
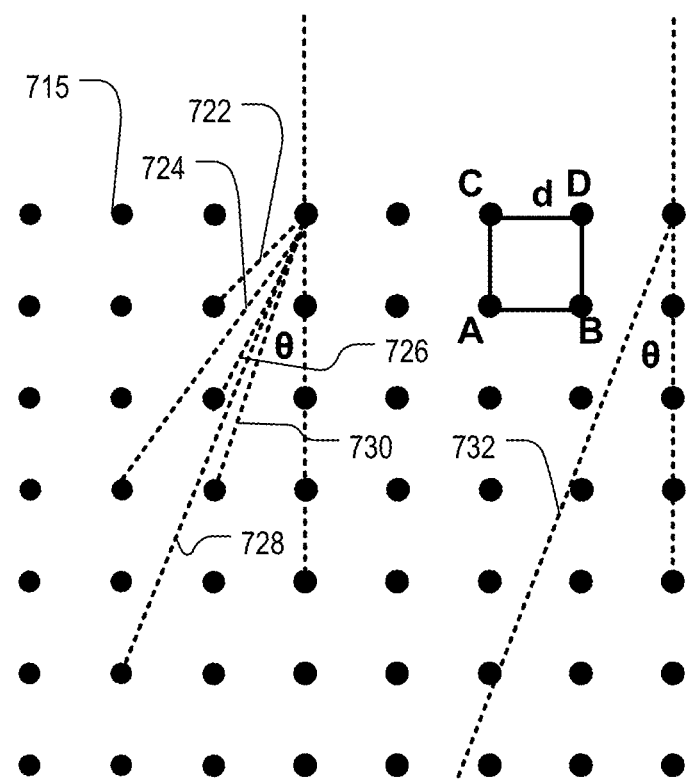
FIG. 7 illustrates the structure of FIG. 5 with several different rotation angles relative to the bit line conductors.

The grid in the structure of FIG. 6 is rotated relative to the bit line conductors 620 by a rotation angle θ=45°. Other rotation angles can be used in different embodiments; however, not all angles will work well. For convenience, FIG. 7 illustrates the structure of FIG. 5 with several different rotation angles relative to the bit line conductors. Instead of showing unrotated bit line conductors on a rotated grid, FIG. 7 shows rotated bit line conductors on an unrotated grid. It will be appreciated that both types of representations describe the same structure, since it is the rotation angle of the grid relative to that of the bit line conductors that is of consequence.

Five angles of rotation are illustrated in FIG. 7. For bit line conductor 722 the rotation angle is θ=45°, which is the same as in FIG. 6. For bit line conductor 724 the rotation angle is θ=arctan(⅔) which is approximately 33.7°. For bit line conductor 726 the rotation angle is θ=arctan(½) which is approximately 26.6°. For bit line conductor 728 the rotation angle is θ=arctan(⅖) which is approximately 21.8°. For bit line conductor 730 the rotation angle is θ=arctan(⅓) which is approximately 18.4°. It can be seen that, at least for the square cell grid of FIG. 7, workable angles of rotation are arctangents of the ratio of two small integers. Angles that do not meet these criteria may not work well. For example, for bit line 732 the rotation angle relative to the grid is θ=arctan(²⁷⁄₄₈) which is approximately 29.4°. The bit line at this angle may miss the process window because it runs too close to pillars that it is not intended to intersect.

It is important that the rotation angle of the grid relative to the bit line conductors as actually fabricated be very close to the angles selected through the method of FIG. 7. This is because the bit line conductors in a typical device are very long, extending all the way across a word line conductor. If the angle as fabricated deviates from the designed angle by too much, then the bit line conductor may miss the process window with respect to a pillar that it is supposed to superpose at the far end of the bit line conductor. As used herein, the rotation angle of the grid is said to "substantially" match the arctangent of the ratio of two small integers, if it matches such angle within acceptable manufacturing tolerances.

Figure 8:
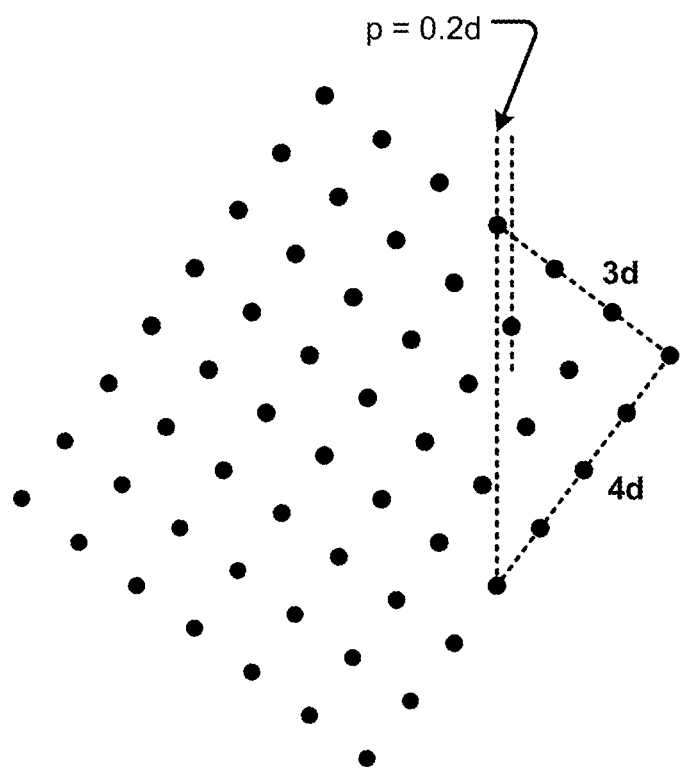
FIG. 8 illustrates a structure in which the grid has been rotated by a particular angle.
Figure 9:
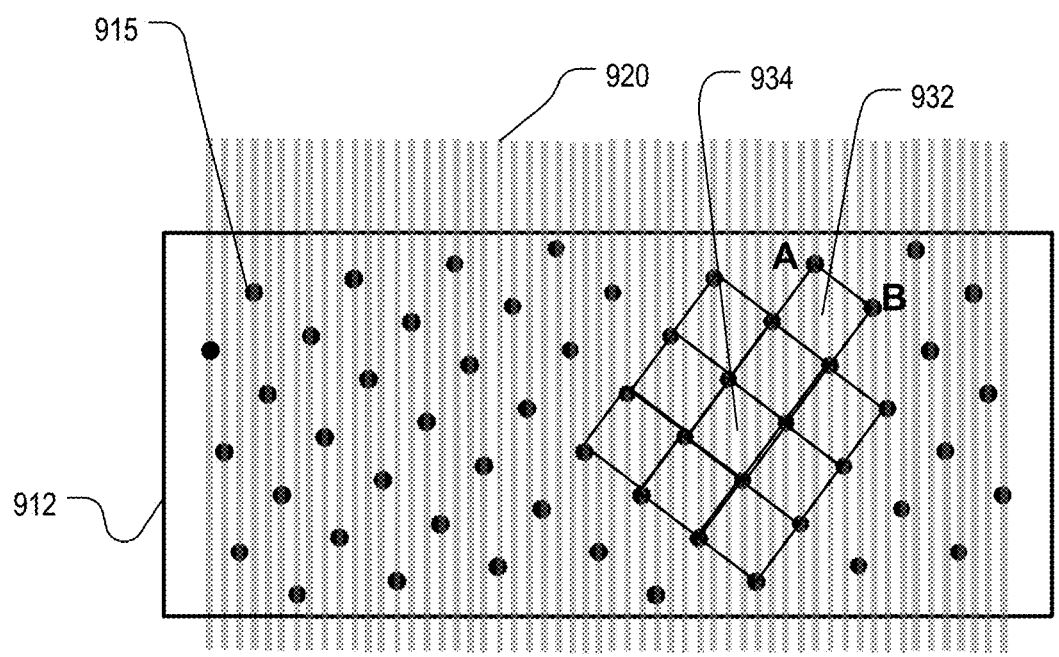
FIG. 9 is another view of the structure of FIG. 8, showing bit line conductors and an SSL.

FIG. 8 illustrates a structure in which the grid has been rotated by an angle θ=arctan(¾) which is approximately 36.9°. The distance between pillars in the lateral dimension orthogonal to the bit lines in this grid can be calculated geometrically and is equal to 0.2d. Thus the bit lines can be spaced with a pitch of p=0.2d, resulting in a five-fold increase in the number of data bits that can be read out in parallel. FIG. 9 illustrates a portion of the same grid as FIG. 8, showing the densely spaced bit line conductors 920. In addition, a single SSL 912 is shown overlying multiple rows of the pillars 915. The use of a single SSL 912 is possible because due to the rotation angle, multiple pillars that previously would have been aligned along a single bit line conductor are now served by different bit line conductors. As a result, the intersection of one SSL 912 and one bit line conductor 920 still uniquely identifies a single one of the pillars 915. Using the grid of FIG. 9, bandwidth increases by a factor of 5, and power consumption and stress each decrease by a factor of 5. In addition, the significant reduction in the number of separate SSLs needed per block also means far fewer decoders are needed, resulting in lower cost.

FIG. 9 also shows a number of unit cells of the regular grid. It can be seen that like the grid of FIG. 6, the string select line 912 has a short dimension (parallel to the bit line conductors 920) which is sufficiently large that it intersects two pillars A and B on one side of one of the unit cells 932. In fact, the short dimension of SSL 912 is sufficiently large as to intersect all four of the pillars in unit cell 932. Still further, the short dimension of SSL 912 is sufficiently large as to intersect pillars in different non-adjacent unit cells, for example a pillar in unit cell 932 and a pillar in unit cell 934.

Figure 10:
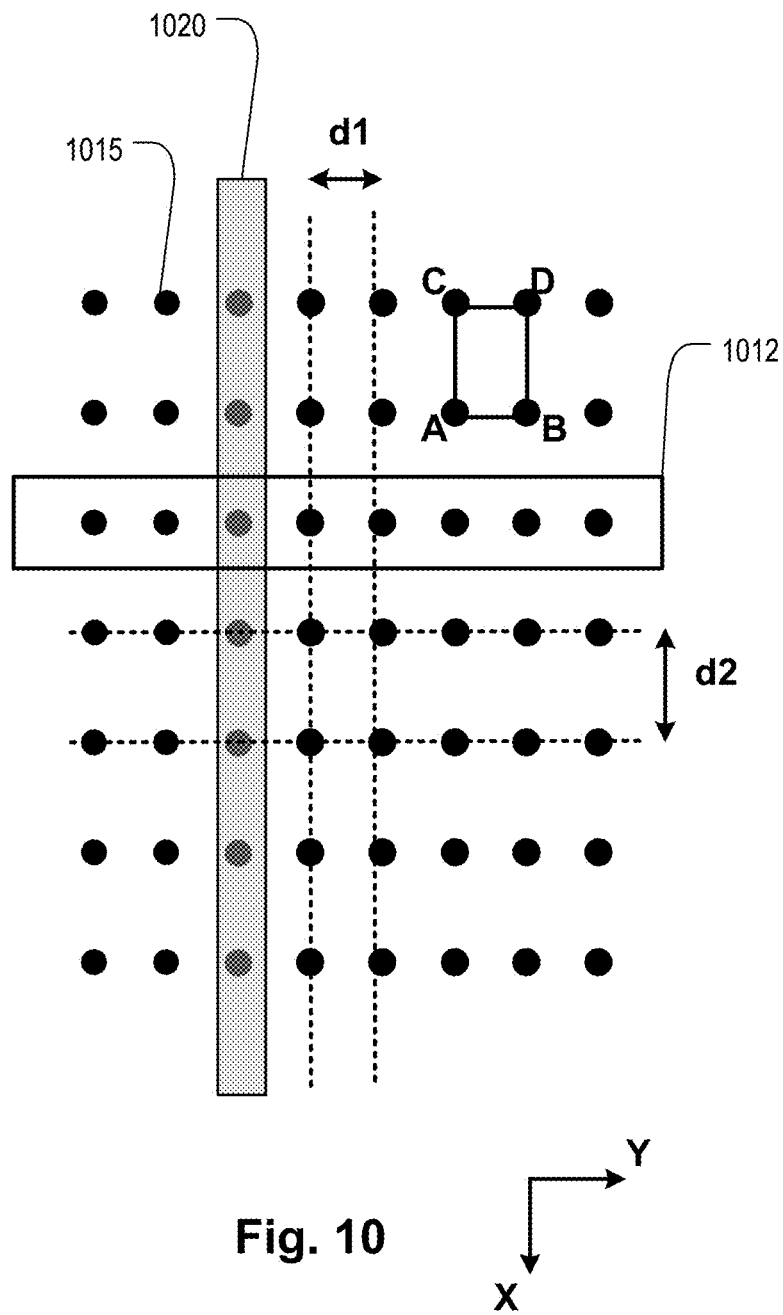
FIG. 10 illustrates a regular grid of pillars in which the unit cell is rectangular.
Figure 11:
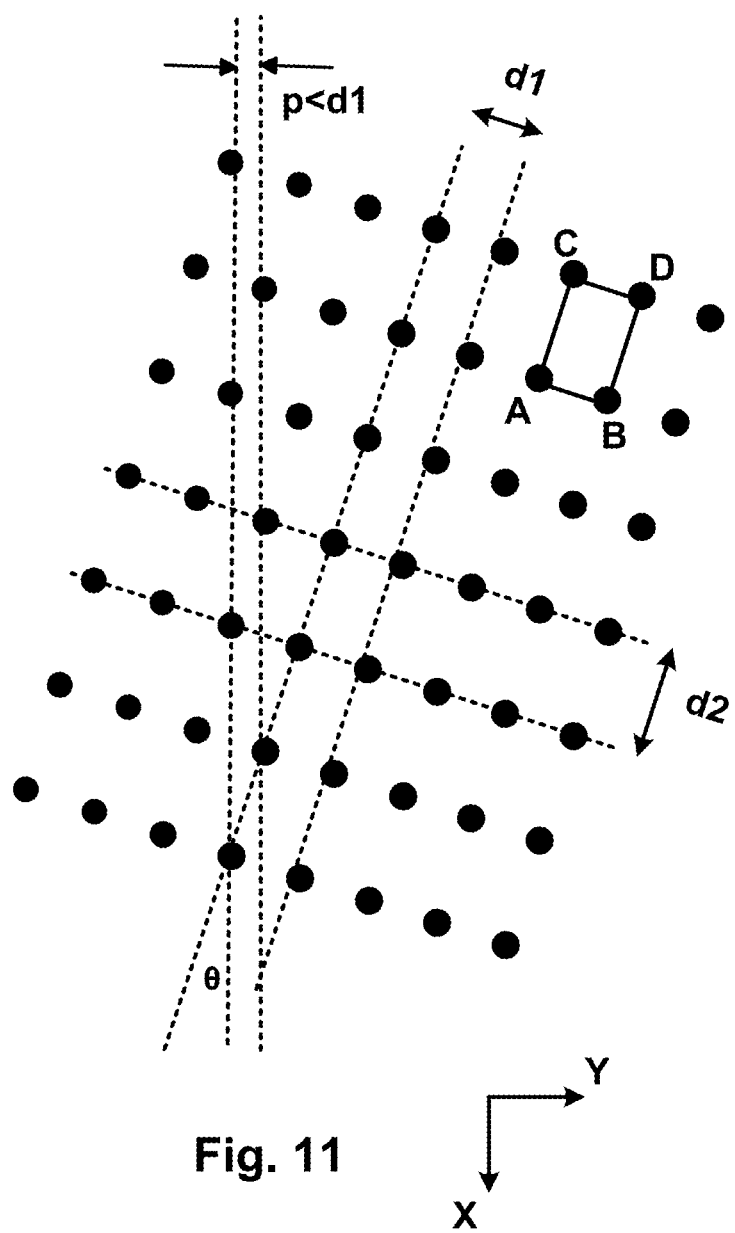
FIG. 11 illustrates the grid of FIG. 10, rotated by an angle $\theta$.

In the embodiments of FIGS. 6, 7, 8 and 9, the regular grid of pillars all have a unit cell shape which is square. That is, the unit cells are all parallelograms in which an angle of the parallelogram is a right angle, and all four sides have equal length d. Grids with other (non-square) rectangular shapes can also take advantage of aspects of the invention. FIG. 10 illustrates a regular grid of pillars 1015 in which the unit cell is rectangular, with the shorter side and longer side having lengths d1 and d2, respectively. A single bit line conductor 1020 is shown in the drawing, as is a single SSL 1012. FIG. 11 illustrates the same grid of pillars rotated by an angle θ, resulting in a bit line conductor pitch p which is narrower than both d1 and d2, and a wider SSL (not shown) which intersects many more pillars than does SSL 1012.

Figure 12:
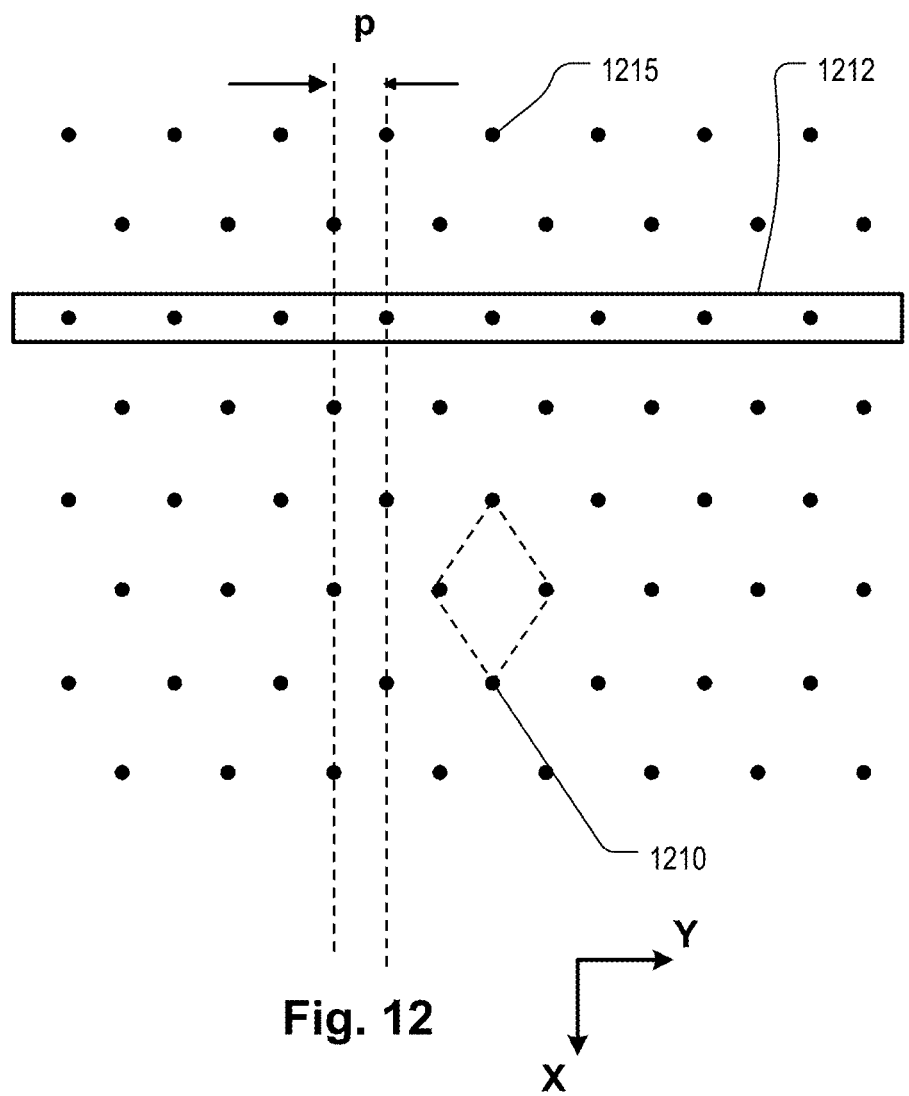
FIG. 12 illustrates a regular grid of pillars in which the unit cell is a diamond.
Figure 13:
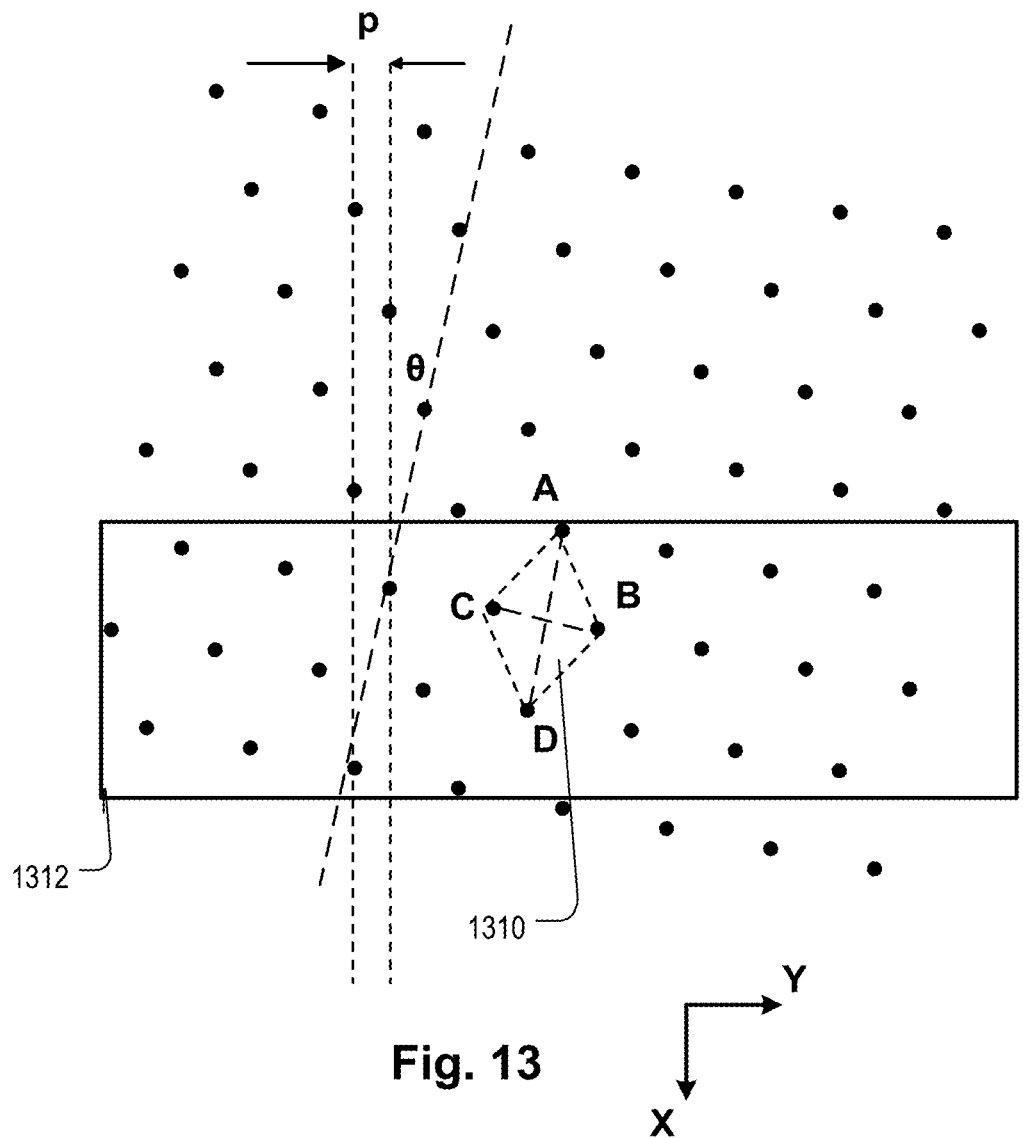
FIG. 13 illustrates the grid of FIG. 12, rotated by an angle $\theta$.

Similarly, FIG. 12 illustrates a regular grid of pillars 1215 in which the unit cell is a diamond 1210. A diamond is a parallelogram in which all four sides have the same length but no pair of adjacent sides forms a right angle. It can also be referred to as a non-square rhombus. FIG. 12 shows the grid with a "normal" orientation, in which a line drawn across the unit cell between opposite pillars is either parallel to or orthogonal to the bit line conductors. The bit line conductors have a pitch p in the drawing. FIG. 13 illustrates the same grid of pillars, rotated by an angle θ, resulting in a narrower bit line conductor pitch p, and a wider SSL 1312 which intersects more pillars than does SSL 1012. The unit cell 1310 is illustrated in FIG. 13 with its vertices labeled ABDC as defined above. It can be seen that with the rotation angle shown, all of $\overline{AB}$, $\overline{AC}$, $\overline{BC}$ and $\overline{AD}$ are neither parallel nor perpendicular to the bit line conductors. Additionally, of special interest are grids with diamond shaped unit cells in which a pair of adjacent sides forms an angle of 60°, as shown in FIGS. 12 and 13. Such a cell has equal spacing d between each pair of pillars on a single side of the cell, and the same spacing d between one pair of opposite pillars of the cell. For example, in the unit cell 1310, all of $\overline{AB}$, $\overline{AC}$, $\overline{CD}$, $\overline{BD}$ and $\overline{BC}$ have the same length d. The area of such a unit cell is $$\frac{\sqrt{3}}{2}d^2,$$

which can be shown to be minimum for a given spacing d.

In general, embodiments of the invention include a regular grid of pillars which is rotated relative to the bit line conductors by an angle θ, such that neither of the lateral dimensions of the grid are parallel to or orthogonal to the bit line conductors. Preferably, in the unit cell ABDC of the grid, defined as set forth above, all of $\overline{AB}$, $\overline{AC}$, $\overline{BC}$ and $\overline{AD}$ are neither parallel nor perpendicular to the bit line conductors.

As described above, rotation of the regular grid permits both narrowing of the pitch of the bit line conductors, as well as widening of the SSLs. However, it is desirable that rotation angles be avoided which result in a narrowing of the pitch by greater than a factor of 10. This is because while the minimum pillar-to-pillar spacing design rules remain satisfied, the design rules specifying a minimum spacing between bit line conductors may not. In addition, a bit line pitch narrowed by more than a factor of 10 might miss the process window as necessary to align with the pillars that the bit line is intended to superpose, or as necessary to miss the pillars that the bit line is intended to miss. For a grid with a square unit cell as in FIG. 7 (i.e. all sides of the unit cell have equal length and a pair of adjacent sides of the unit cell forms a right angle), this means that the angle of rotation θ with respect to the bit line conductors should be such that tan(0θ)=±X/Y, where X and Y are single-digit co-prime integers. Said another way, for the unit cell ABDC as defined above, either $\overline{AB}$ or $\overline{AC}$ makes an angle θ with the bit line conductors, where tan(θ)=X/Y, and X and Y are single-digit co-prime integers.

Table I lists all of the single digit co-prime integer pairs (X,Y), their corresponding angles of rotation, and their resulting bit line conductor pitch:

TABLE I

| X | Y | θ (degrees) | pitch |
|---|---|---|---|
| 1 | 1 | 45.0 | 0.707107 |
| 1 | 2 | 26.6 | 0.447214 |
| 1 | 3 | 18.4 | 0.316228 |
| 1 | 5 | 11.3 | 0.242536 |
| 1 | 5 | 11.3 | 0.196116 |
| 1 | 6 | 9.5 | 0.164399 |
| 1 | 7 | 8.1 | 0.141421 |
| 1 | 8 | 7.1 | 0.124035 |
| 1 | 9 | 6.3 | 0.110432 |
| 2 | 3 | 33.7 | 0.27735 |
| 2 | 5 | 21.8 | 0.185695 |
| 2 | 7 | 15.9 | 0.137361 |
| 2 | 9 | 12.5 | 0.108465 |
| 3 | 4 | 36.9 | 0.2 |
| 3 | 5 | 31.0 | 0.171499 |
| 3 | 7 | 23.2 | 0.131306 |
| 3 | 8 | 20.6 | 0.117041 |
| 4 | 5 | 38.7 | 0.156174 |
| 4 | 7 | 29.7 | 0.124035 |
| 4 | 9 | 24.0 | 0.101535 |
| 5 | 6 | 39.8 | 0.128037 |
| 5 | 7 | 35.5 | 0.116248 |
| 5 | 8 | 32.0 | 0.106 |
| 6 | 7 | 40.6 | 0.108465 |

Thus preferably the angle of rotation θ with respect to the bit line conductors for grids with a square unit cell should be such that tan(θ)=±X/Y, where the pair (X,Y) is included in Table I.

Figure 14:
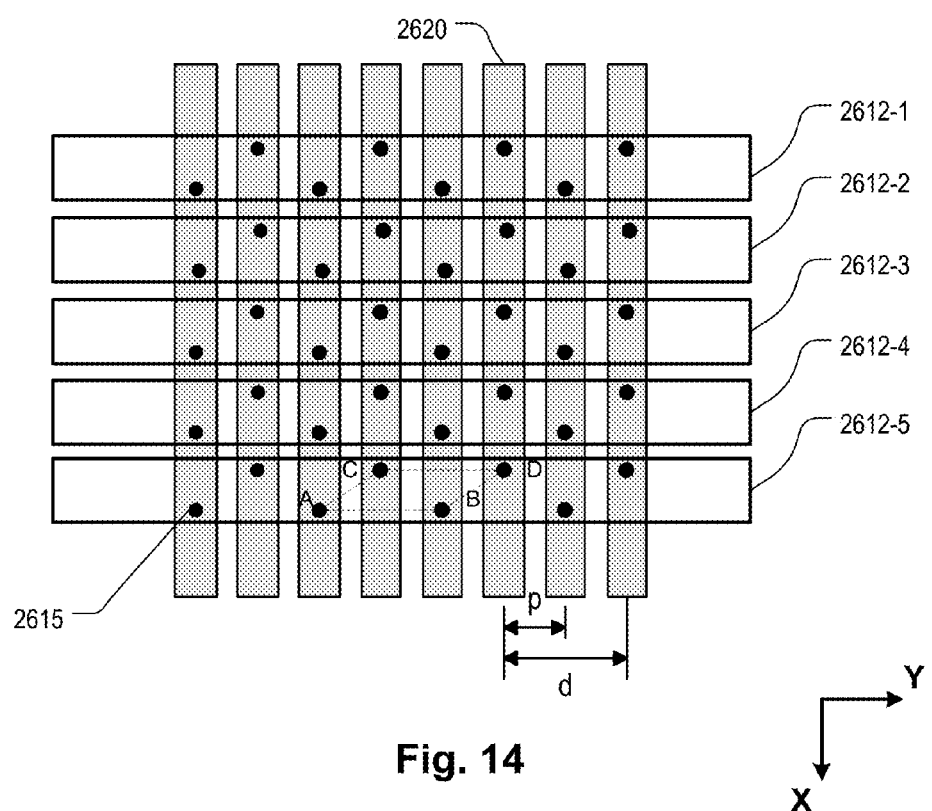
FIGS. 14, 15, 17 and 18 are top views of arrays of pillars in a 3D structure according to an aspect of the invention.

FIG. 14 is a top view of an array of pillars in a 3D structure according to another aspect of the invention. As with FIG. 5, each dot in FIG. 14 represents the lateral position of a corresponding pillar 2615. The structure includes all the other elements seen in FIG. 2, though most have been omitted from FIG. 14 for clarity of illustration. Five string select lines 2612-1 through 2612-5 (collectively 2612) are shown, as are eight bit line conductors 2620.

Figure 15:
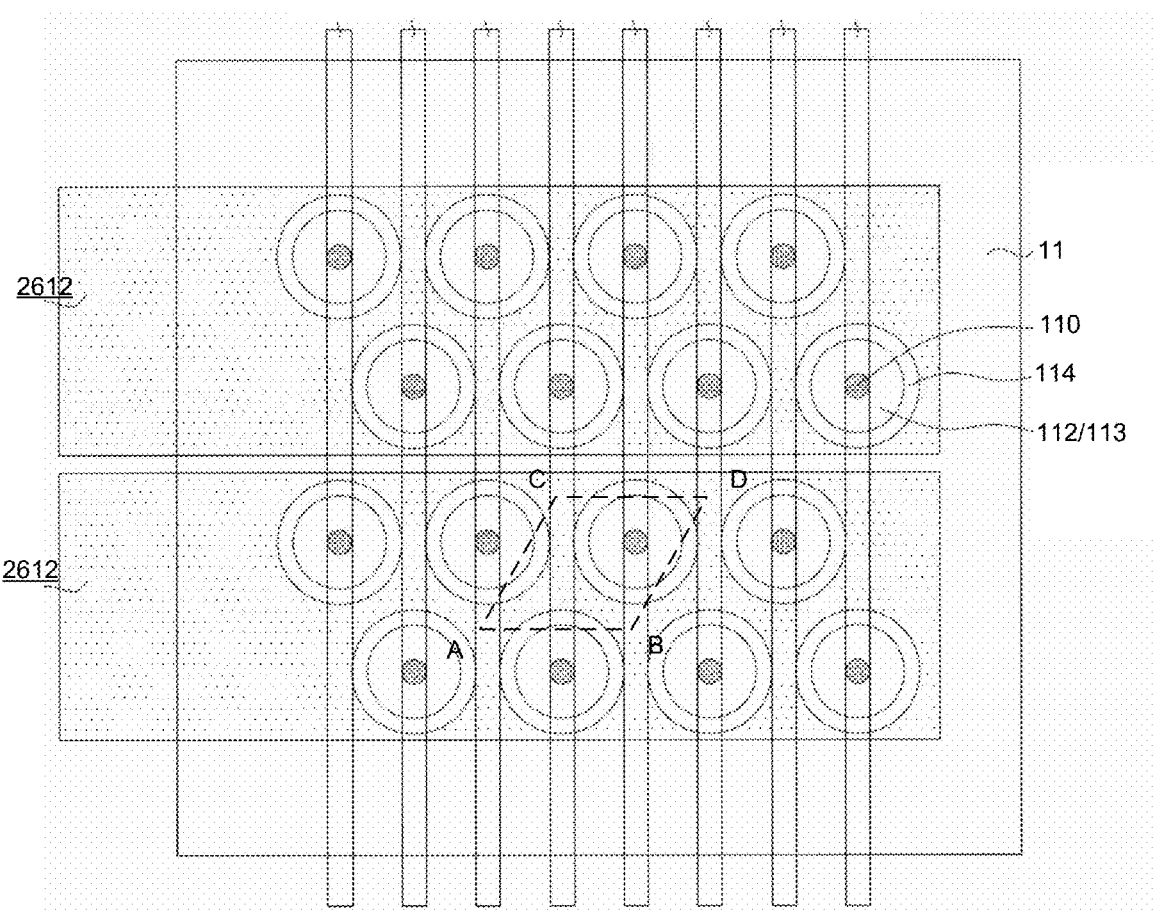

As with the structure of FIG. 5, each of the string select lines 2612 in FIG. 14 intersects a respective distinct subset of the pillars 2615, the intersections defining select gates. Similarly, each of the bit line conductors 2620 superposes a respective column of the pillars 2615, and each of the pillars 2615 underlies one of the bit line conductors 2620. In the structure of FIG. 14, however, while the pillars still form rows oriented orthogonally to the bit lines, the pillars in each such row intersects only every other bit line, and alternating rows are shifted so as to intersect alternating sets of the bit lines. FIG. 15 is another illustration of the arrangement of FIG. 14, except that the pillars 2615 are shown more in accordance with FIG. 1. Also fewer pillars 2615, bit lines 2620, and SSLs 2612 are shown. In both figures a parallelogram unit cell ABDC is shown.

The shifting of alternating rows of pillars provides two advantages. First, if d is the distance between the pillars in the direction perpendicular to the bit lines, then the bit lines 2620 can be formed on a narrower pitch p=d/2. This permits a higher density of bit lines without any reduction needed in the spacing d between adjacent pillars in the grid. Second, the number of SSLs 2612 is reduced because each SSL 2620 has been made wide enough (in the dimension parallel to the bit lines 2620) to intersect two rows of pillars. Stated differently, each SSL 2620 is wide enough to intersect all four pillars of a unit cell. For example, in each of FIGS. 14 and 15, one SSL 2612 intersects all four pillars of the unit cell ABDC. And despite intersecting two rows of pillars, each intersection of one of the string select lines 2612 and one of the bit line conductors 2620 still uniquely enables a single one of the pillars in the grid. That is, activation of one word line conductor 11 and one SSL 2612 still selects only a single memory cell to each bit line conductor 2620. Thus the parallelogram grid of FIGS. 14 and 15 achieves both a higher density of bit lines 2620, thereby enabling a higher data rate due to increased parallel operation, and also a lower number of SSLs, thereby reducing disturbance, reducing power consumption and further improving data rate by reducing unit cell capacitance.

Figure 16A:
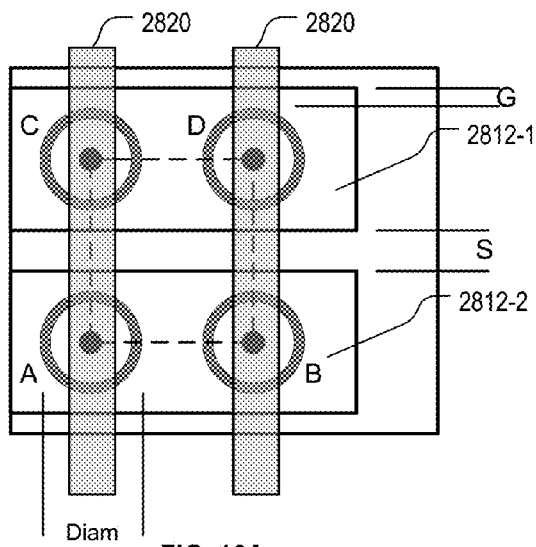
FIGS. 16A, 16B, 16C and 16D (collectively FIG. 16) illustrate a unit parallelogram cell in several variations.

FIGS. 16A-16D (collectively FIG. 16) illustrate some of the benefits of the parallelogram cell arrangement. FIG. 16A illustrates a unit cell in a conventional grid such as that of FIG. 3. In this example the center-to-center distance between pillars A and B is the same as the center-to-center distance between pillars C and D, and is given roughly by the diameter of the pillar plus the minimum gate thickness G. But because of the extra spacing S between the two SSLs 2812-1 and 2812-2 (collectively 2812) as required by design rules, and because of a more severe edge gate rule G, the distance in the bit line direction, between pillars A and C and between pillars B and D, must be larger than the distance between pillars A and B and between pillars C and D.

Figure 16B:
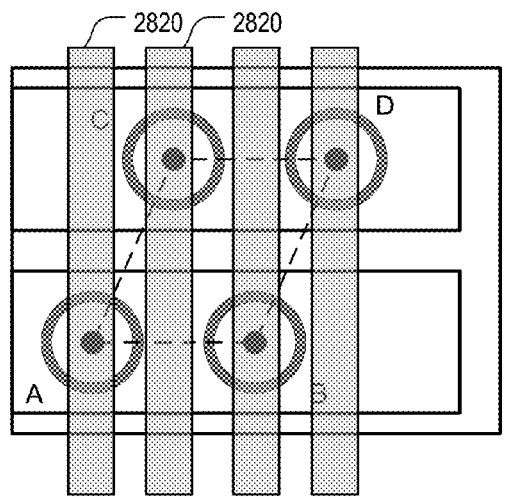
Figure 16C:
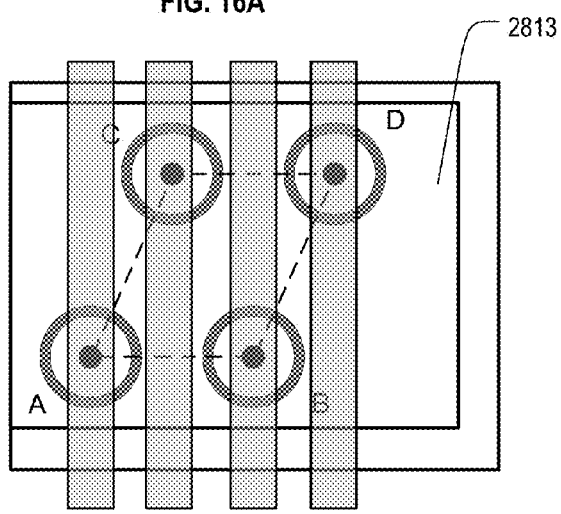
Figure 16D:
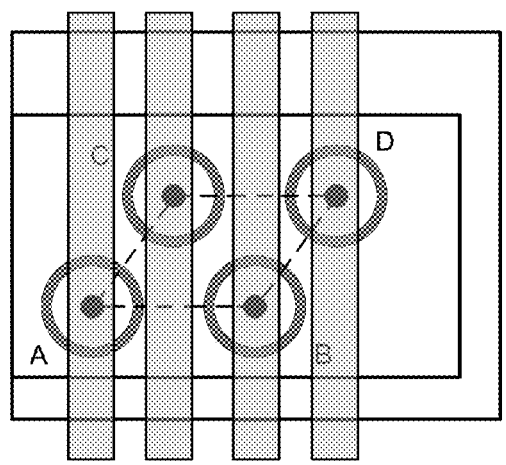

In FIG. 16B the upper row of pillars has been shifted to the right by one-half the distance between them. The cell is now a non-rectangular parallelogram. Since the bit lines 2820 do not have to be as wide as SSLs or even as wide as a pillar, in the configuration of FIG. 16B twice as many bit lines 2820 can be accommodated, thereby doubling the data rate by increased parallel operation. The bit line pitch has been reduced to p=d/2, where d is the distance between the pillars in the dimension perpendicular to the bit lines. But since alternating pillars now underlie alternating bit lines 2820, they can be decoded together by merging the SSLs 2812-1 and 2812-2 into a single SSL 2813 as shown in FIG. 16C. This reduces the number of SSLs by half, thereby reducing disturbance, reducing power consumption and further improving data rate by reducing unit cell capacitance. Finally, with the merged SSL, the design rule limitations on spacing in the bit line dimension can be relaxed. Since there is no longer a requirement for spacing S or for the more severe edge gate rule G, the spacing between the two rows of pillars can be reduced in the bit line dimension as shown in FIG. 16D. The width of SSL 2813 in the bit line dimension has been reduced accordingly as well.

The reduced height of the unit cell in the bit line dimension also results in a smaller unit cell area. In FIG. 16A, the area of the cell of FIG. 16A is $\overline{AB}\cdot\overline{BD}$, which is larger than $d^2$ because the length of $\overline{BD}$ is larger than d. The cell area remains the same in FIGS. 16B and 16C. But because the height of the unit cell in the bit line dimension is shorter in FIG. 8D than in FIGS. 16A-16C, the area of the unit cell in FIG. 16D is smaller as well.

In a preferred embodiment, height of the unit cell in the bit line dimension is reduced until the spacing between pillars is constant on all sides of the parallelogram. That is, the lengths of line segments $\overline{AB}$, $\overline{BD}$, $\overline{AC}$ and $\overline{CD}$ are all equal to d, and the parallelogram is a rhombus. Still more preferably, the narrow angle of the rhombus is made equal to 60°, so that the length of $\overline{BC}$ is also equal to d. In this case the area of the unit cell is only $(\sqrt{3}/2)*d^2$, which is a minimum.

The technique of shifting rows of pillars in the direction perpendicular to the bit lines can be extended to shifting a larger number of rows by different amounts. For example, FIG. 9 illustrates three adjacent rows of pillars, each shifted by a distance d/3 relative to the immediately adjacent row of pillars. As a result, three times as many bit lines 2820 can be accommodated, thereby greatly increasing parallel operation. The bit line pitch has been reduced to p=d/3, and a single merged SSL reduces the number of SSLs in the grid by ⅔, thereby further reducing disturbance, further reducing power consumption and further improving data rate by reducing unit cell capacitance. Finally, with the merged SSL, the design rule requirements for inter-SSL spacings S and dual gate thicknesses G have been reduced as well across the grid of pillars.

Figure 18:
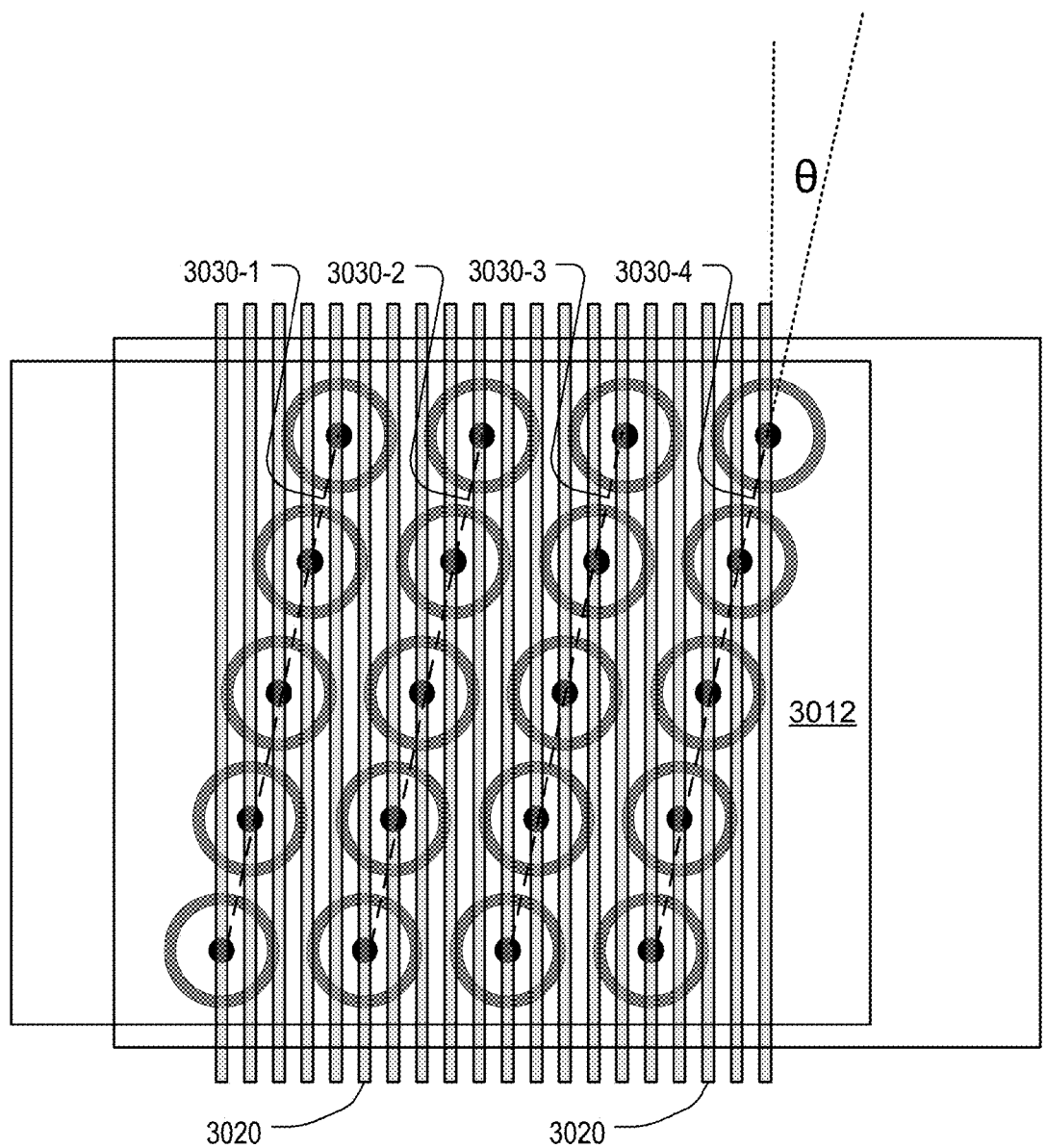

Similarly, FIG. 18 illustrates five adjacent rows of pillars, each shifted by a distance d/5 relative to the immediately adjacent row of pillars. As a result, five times as many bit lines 2820 can be accommodated, thereby increasing parallel operation even further. The bit line pitch has been reduced to p=d/5, and a single merged SSL reduces the number of SSLs in the grid by ⅘, thereby still further reducing disturbance, still further reducing power consumption and still further improving data rate by reducing unit cell capacitance. Finally, with the merged SSL, the design rule requirements for inter-SSL spacings S and severity of the gate thicknesses design rule G have been reduced even further across the grid of pillars.

In general, the technique of shifting rows of pillars in the direction perpendicular to the bit lines can be extended to shifting rows by a distance d/n relative to the immediately adjacent row of pillars. As a result, n times as many bit lines can be accommodated, thereby greatly increasing parallel operation. The bit line pitch has been reduced to p=d/n, and a single merged SSL reduces the number of SSLs in the grid by (n−1)/n, thereby further reducing disturbance, further reducing power consumption and further improving data rate by reducing unit cell capacitance. Finally, with the merged SSL, the design rule requirements for spacings S and G are reduced as well across the grid of pillars.

Figure 17:
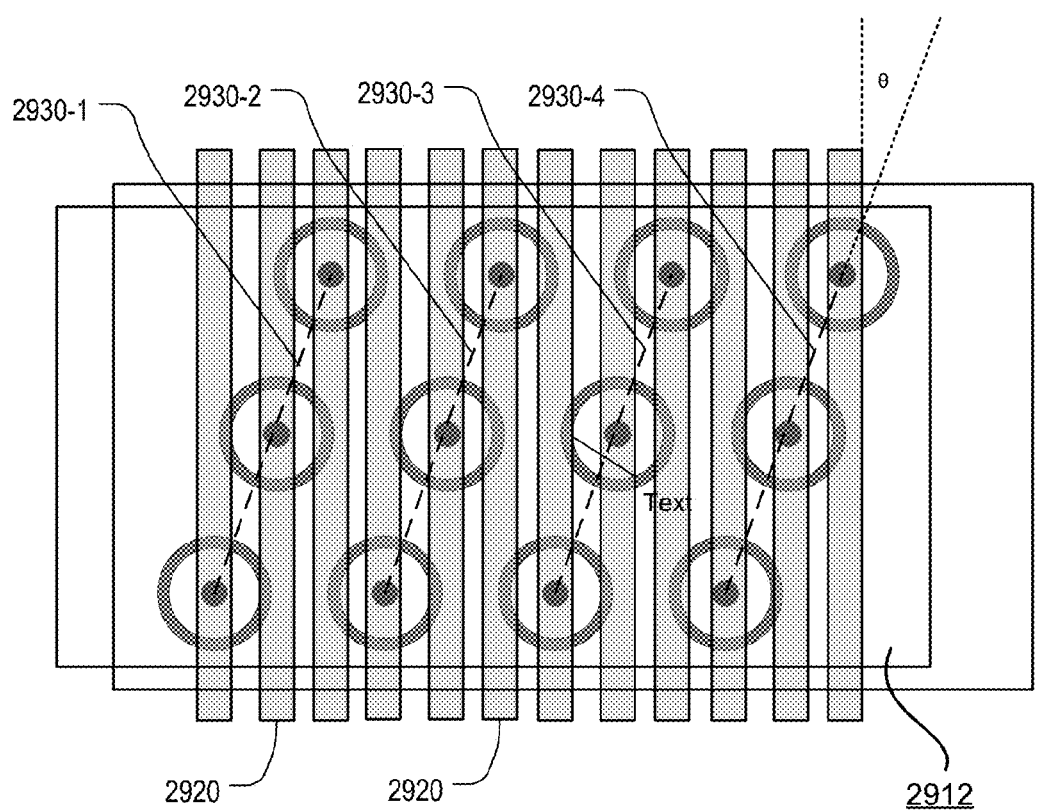

Referring again to FIG. 17, it can be seen that the pillars in the grid are disposed laterally in such a way that in plan view they form a number of lines of pillars, indicated in the drawing as broken "pillar lines" 2930-1, 2930-2, 2930-3 and 2930-4 (collectively 2930). (The pillar lines themselves are provided for visualization purposes, and do not represent any physical features on the device.) These lines are all parallel to each other and bear an acute angle θ>0° of intersection with the bit line conductors 2920. In addition, it can be seen that each of the pillar lines has exactly 3 pillars within the region of one of the string select lines 2912. All three pillars in each pillar line intersect a single common one of the string select lines 2912.

Similarly, referring to FIG. 18, it can be seen that the pillars in the grid are disposed laterally in such a way that in plan view they form a number of lines of pillars, indicated in the drawing as pillar lines 3030-1, 3030-2, 3030-3 and 3030-4 (collectively 3030). These lines are all parallel to each other and bear a different acute angle θ>0° of intersection with the bit line conductors 1020. In addition, it can be seen that each of the pillar lines has exactly 5 pillars within the region of one of the string select lines 3012. All five pillars in each pillar line intersect a single common one of the string select lines 3012.

Again in the general case, for each value of n, the pillars in the grid are disposed laterally in such a way that in plan view they form a number of lines of pillars. These pillar lines are all parallel to each other and bear an acute angle θ>0° of intersection with the bit line conductors. In addition, each of the pillar lines has exactly n pillars within the region of one of the string select lines. All n pillars in each pillar line intersect a single common one of the string select lines.

Accordingly, shifting of rows of pillars in a dimension perpendicular to the bit lines permits both narrowing of the pitch of the bit line conductors, as well as widening of the SSLs. However, it is desirable that shifting distances be avoided which result in a narrowing of the pitch by greater than a factor of 10. This is because while the minimum pillar-to-pillar spacing design rules may remain satisfied, the design rules specifying a minimum spacing between bit line conductors may not. In addition, a bit line pitch narrowed by more than a factor of 10 might miss the process window as necessary to align with the pillars that the bit line is intended to superpose, or as necessary to miss the pillars that the bit line is intended to miss. These become significant risks for values of n>10. This limit on n is substantially independent of process shrinking, since the bit line pitch d/n shrinks by the same factor that the spacing d between pillars shrinks. Accordingly, it is preferable to limit n≤10. Note that n should be an integer.

As used herein, a given value is "responsive" to a predecessor value if the predecessor value influenced the given value. If there is an intervening processing element, step or time period, the given value can still be "responsive" to the predecessor value. If the intervening processing element or step combines more than one value, the signal output of the processing element or step is considered "responsive" to each of the value inputs. If the given value is the same as the predecessor value, this is merely a degenerate case in which the given value is still considered to be "responsive" to the predecessor value. "Dependency" of a given value upon another value is defined similarly.

As used herein, the "identification" of an item of information does not necessarily require the direct specification of that item of information. Information can be "identified" in a field by simply referring to the actual information through one or more layers of indirection, or by identifying one or more items of different information which are together sufficient to determine the actual item of information. In addition, the term "indicate" is used herein to mean the same as "identify".

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The foregoing description of preferred embodiments of the present invention has been provided for the purposes of illustration and description. It is not intended to be exhaustive or to limit the invention to the precise forms disclosed.

Obviously, many modifications and variations will be apparent to practitioners skilled in this art. For example, whereas embodiments herein are described using vertical channel charge storage memory cells, pillars with other types of memory cells can make use of aspects of the invention as well, albeit without necessarily achieving all of the benefits described above. In particular, and without limitation, any and all variations described, suggested or incorporated by reference in the Background section of this patent application are specifically incorporated by reference into the description herein of embodiments of the invention. In addition, any and all variations described, suggested or incorporated by reference herein with respect to any one embodiment are also to be considered taught with respect to all other embodiments. The embodiments described herein were chosen and described in order to best explain the principles of the invention and its practical application, thereby enabling others skilled in the art to understand the invention for various embodiments and with various modifications as are suited to the particular use contemplated. It is intended that the scope of the invention be defined by the following claims and their equivalents.

The invention claimed is:

1. A memory device on a substrate, comprising:
a stack of conductive layers, each of the layers being oriented parallel to the substrate;
a plurality of parallel bit line conductors parallel to the substrate;
a plurality of pillars oriented orthogonally to the substrate;
a plurality of memory cells located at cross-points between the pillars and the conductive layers, wherein the pillars in the plurality of pillars are arranged on a regular grid in which rows are oriented orthogonally to the bit line conductors, the regular grid having a unit cell of four of the pillars A, B, C and D located at vertices of a parallelogram,
pillar B being a pillar which is nearest to pillar A in the grid,
and pillar D being a pillar which is non-collinear with pillars A and B; and
a plurality of string select lines oriented parallel to the substrate, each of the string select lines intersecting a respective distinct subset of the pillars, each of the intersections of a pillar and a string select line defining a respective select gate of the pillar, and each intersection of one of the string select lines and one of the bit line conductors uniquely identifying a single one of the pillars in the plurality,
wherein the string select lines comprise rectangles having a long dimension oriented orthogonally to the bit line conductors,
wherein the plurality of bit line conductors are orthogonal to a direction from pillar A to pillar D,
wherein a center-to-center distance between pillar A and pillar B is not equal to a center-to-center distance between pillar A and pillar D,
and wherein a particular one of the string select lines has a short dimension which is sufficiently large that the particular string select line intersects at least three of the rows of pillars.

2. The memory device of claim 1, wherein the distance between pillar A and pillar D is larger than the distance between pillar A and pillar B.

3. The device of claim 1, wherein the regular grid is such that every pair of pillars in the plurality of pillars, which pair are not aligned with each other in a dimension parallel to the bit line conductors, are separated in a lateral dimension orthogonal to the bit line conductors by at least d/10, where d is the shortest Euclidean distance between pillars in the plurality of pillars.

4. The device of claim 1,
wherein one of the string select lines has a short dimension which is sufficiently large that it intersects all four pillars of a particular one of the unit cells.

5. A memory device on a substrate, comprising:
a stack of conductive layers, each of the layers being oriented parallel to the substrate;
a plurality of parallel bit line conductors parallel to the substrate;
a plurality of pillars oriented orthogonally to the substrate; and
a plurality of memory cells located at cross-points between the pillars and the conductive layers, wherein the pillars in the plurality of pillars are arranged on a regular grid, the regular grid having a unit cell of four of the pillars A, B, C and D located at vertices of a parallelogram,
pillar B being a pillar which is nearest to pillar A in the grid,
pillar D being a pillar which is non-collinear with pillars A and B and a center-to-center distance between pillar A and pillar B is not equal to a center-to-center distance between pillar A and pillar D, and the plurality of bit line conductors are orthogonal to a direction from pillar A to pillar D,
further comprising a plurality of string select lines oriented parallel to the substrate, each of the string select lines intersecting a respective distinct subset of the pillars, each of the intersections of a pillar and a string select line defining a respective select gate of the pillar,
wherein the string select lines comprise rectangles having a long dimension oriented orthogonally to the bit line conductors,
wherein each intersection of one of the string select lines and one of the bit line conductors uniquely identifies a single one of the pillars in the plurality,
and wherein a particular one of the string select lines intersects all four pillars of the particular unit cell.

6. The memory device of claim 5, wherein the distance between pillar A and pillar D is larger than the distance between pillar A and pillar B.

7. The device of claim 5, wherein the regular grid is such that every pair of pillars in the plurality of pillars, which pair are not aligned with each other in a dimension parallel to the bit line conductors, are separated in a lateral dimension orthogonal to the bit line conductors by at least d/10, where d is the shortest Euclidean distance between pillars in the plurality of pillars.

8. A memory device on a substrate, comprising:
a stack of conductive layers, each of the layers being oriented parallel to the substrate;
a plurality of parallel bit line conductors parallel to the substrate;
a plurality of pillars oriented orthogonally to the substrate; and
a plurality of memory cells located at cross-points between the pillars and the conductive layers, wherein the pillars in the plurality of pillars are arranged on a regular grid in which rows are oriented orthogonally to the bit line conductors, the regular grid having a unit cell of four of the pillars A, B, C and D located at vertices of a parallelogram, pillar B being a pillar which is nearest to pillar A in the grid, pillar C being a pillar which is non-collinear with pillars A and B but which is otherwise nearest pillar A in the grid, a center-to-center distance between pillar A and B being substantially equal to a center-to-center distance between pillar A and C, and pillar D being a pillar which is non-collinear with pillars A and B, and the plurality of bit line conductors are orthogonal to a direction from pillar A to pillar D, the device further comprising a plurality of string select lines oriented parallel to the substrate, each of the string select lines intersecting a respective distinct subset of the pillars, each of the intersections of a pillar and a string select line defining a respective select gate of the pillar, wherein the string select lines comprise rectangles having a long dimension oriented orthogonally to the bit line conductors, wherein each intersection of one of the string select lines and one of the bit line conductors uniquely identifies a single one of the pillars in the plurality, and wherein a particular one of the string select lines has a short dimension which is sufficiently large that the particular string select line intersects at least three of the rows of the pillars in the grid.

9. The memory device of claim 8, wherein a center-to-center distance between pillar A and pillar D is not equal to the distance between pillar A and pillar B.

10. The memory device of claim 8, wherein the distance between pillar A and pillar D is larger than the distance between pillar A and pillar B.

11. The device of claim 8, wherein the particular string select line has a short dimension which is sufficiently large that the particular string select line intersects at least three pillars of a particular one of the unit cells.

\* \* \* \* \*